(12) United States Patent
Kudo

(10) Patent No.: US 7,834,694 B2
(45) Date of Patent: Nov. 16, 2010

(54) DIFFERENTIAL CURRENT MIRROR CIRCUIT

(75) Inventor: Masahiro Kudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 336 days.

(21) Appl. No.: 12/192,188

(22) Filed: Aug. 15, 2008

(65) Prior Publication Data

US 2009/0160420 A1 Jun. 25, 2009

(30) Foreign Application Priority Data

Dec. 25, 2007 (JP) .............................. 2007-331958

(51) Int. Cl.
*H03F 3/45* (2006.01)
(52) U.S. Cl. ...................................... 330/257; 330/253
(58) Field of Classification Search ................. 330/253, 330/257

See application file for complete search history.

(56) References Cited

U.S. PATENT DOCUMENTS 5,198,781 A 3/1993 Kusakabe 6,605,998 B2 * 8/2003 Kimura ....................... 330/257
7,119,616 B2 * 10/2006 Benzer ....................... 330/257

FOREIGN PATENT DOCUMENTS

| JP | 4-76941  | 3/1992 |
| JP | 6-140844 | 5/1994 |
| JP | 2610361  | 2/1997 |

* cited by examiner

*Primary Examiner*—Khanh V Nguyen
(74) *Attorney, Agent, or Firm*—Katten Muhcin Rosenman LLP

(57) ABSTRACT

A differential current mirror circuit includes: a first branching unit that branches current through a first current input terminal to a first current path and a second current path; a second branching unit that branches current through a second current input terminal to a third current path and a fourth current path; and a current mirror that copies current. The current copied by the current mirror is a combination of the current flowing through the second current path and the fourth current path and removal of the in-phase component from current through the first current path enables only the differential component flowing through the first current path to flow to a first current output terminal. Similarly, the in-phase component from current through the third current path is removed, enabling only the differential component flowing through the third current path to flow to a second current output terminal.

7 Claims, 7 Drawing Sheets

US 7,834,694 B2

DIFFERENTIAL CURRENT MIRROR CIRCUIT

CROSS-REFERENCE TO RELATED APPLICATIONS

This application is based upon and claims the benefit of priority from Japanese Patent Application No. 2007-331958, filed Dec. 25, 2007, the entire contents of which are incorporated herein by reference.

BACKGROUND

1. Field

The present invention relates to a differential current mirror circuit that copies a current by an arbitral magnitude.

2. Description of the Related Art

Conventionally, a current mirror circuit is a fundamental circuit block of analog circuits. As a current mirror circuit that processes a differential signal, an analog circuit cell is commonly known that includes the following components: (1) a current-sinking input terminal; (2) an input unit that is connected to the input terminal and utilizes low impedance that is of a bipolar transistor of first polarity and due to negative feedback; (3) a current-sourcing output terminal; (4) an output unit that is connected to the output terminal and utilizes high collector impedance of a bipolar transistor of second polarity; and (5) a processing unit that executes a given process according to the sinking current from the input unit, and sources the current through the output unit. By using a differential current, a signal is passed between current-sourcing output terminals and current-sinking input terminals of different analog circuit cells (see, for example, Japanese Patent No. 2610361).

However, the circuit cannot eliminate the in-phase current. As a result, the error of bias current due to the in-phase current caused by the fluctuation of power supply and/or the mismatch of transistors is amplified as it is, thereby impairing the accuracy of the signal processing.

SUMMARY OF THE INVENTION

A differential current mirror circuit according to one aspect of the present invention includes a first current input terminal through which a current including an in-phase component and a differential component flows; a second current input terminal through which a current including an in-phase component and a differential component flows; a first branching unit that branches the current through the first current input terminal to a first current path and a second current path; a second branching unit that branches the current through the second current input terminal to a third current path and a fourth current path; a fifth current path that is connected to the second current path and the fourth current path; a first current source that allows an in-phase component current to flow through the first current path based on a current through the fifth current path; a sixth current path through which a current through the first current path minus the current allowed to flow by the first current source flows; a first current output terminal through which a current flows based on the current through the sixth current path; a second current source that allows an in-phase component current to flow through the third current path based on the current through the fifth current path; a seventh current path through which a current through the third current path minus the current allowed to flow by the second current source flows; and a second current output terminal through which a current flows based on the current through the seventh current path.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Referring to the accompanying drawings, exemplary embodiments according to the present invention are explained in detail below. In the explanation of the first to fourth embodiments, similar components are assigned with similar reference signs and redundant explanations thereof are omitted.

Figure 1:
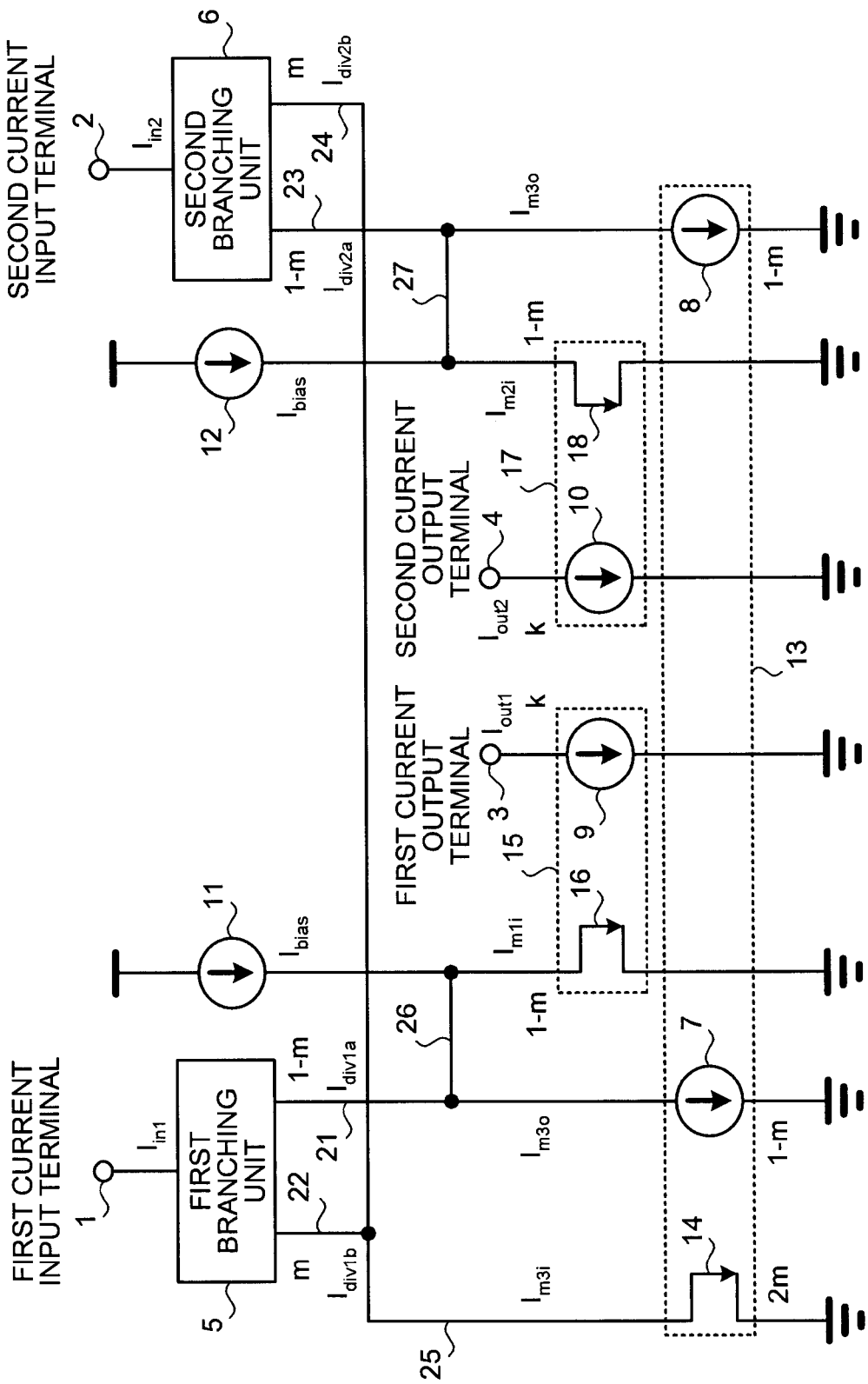
FIG. 1 is a circuit diagram of a differential current mirror circuit according to a first embodiment.

FIG. 1 is a circuit diagram of a differential current mirror circuit according to the first embodiment. As shown in FIG. 1, the differential current mirror circuit includes a first current input terminal 1, a second current input terminal 2, a first current output terminal 3, a second current output terminal 4, a first branching unit 5, a second branching unit 6, a first current source 7, a second current source 8, a third current source 9, a fourth current source 10, a first bias current source 11, and a second bias current source 12.

A current including an in-phase component and a differential component flows into the first current input terminal 1 and the second current input terminal 2, respectively. The first branching unit 5 branches the current from the first current input terminal 1 to a first current path 21 and a second current path 22. The ratio of the current through the first current path 21 and the current through the second current path 22 is $(1-m):m$, where $0<m<1$. The second branching unit 6 branches the current from the second current input terminal 2 to a third current path 23 and a fourth current path 24. The ratio of the current through the third current path 23 and the current through the fourth current path 24 is $(1-m):m$.

The second current path 22 and the fourth current path 24 are connected to a fifth current path 25, and the sum of currents through the second current path 22 and the fourth current path 24 flows through the fifth current path 25. The fifth current path 25 is connected to a first current input path 14 that forms a third current mirror 13 with the first current source 7 and the second current source 8.

The first current source 7 is connected to the first current path 21 as one current output path of the third current mirror 13. The second current source 8 is connected to the third current path 23 as another current output path of the third current mirror 13. The first current source 7 and the second current source 8 respectively allow a current to flow that is (1−m)/2m times as much as the current through the first current input path 14.

A sixth current path 26 is connected to a node between the first current path 21 and the first current source 7. Thus, the current through the sixth current path 26 is the result of subtracting the current allowed to flow by the first current source 7 from the current through the first current path 21. The sixth current path 26 is connected to a second current input path 16 that forms a first current mirror 15 with the third current source 9. The second current input path 16 is connected to the first bias current source 11. Thus, the current through the second current input path 16 is the total of the current through the first current path 21 minus the current allowed to pass by the first current source 7 plus the bias current allowed to flow by the first bias current source 11.

The third current source 9 is connected to the first current output terminal 3 as a current output path of the first current mirror 15. The third current source 9 allows a current to flow that is k/(1−m) times as much as the current through the second current input path 16, where k is a positive integer. Thus, the current flowing into the first current output terminal 3 is k/(1−m) times as much as the current through the second current input path 16.

A seventh current path 27 is connected to a node between the third current path 23 and the second current source 8. Thus, the current through the seventh current path 27 is the result of subtracting the current allowed to flow by the second current source 8 from the current through the third current path 23. The seventh current path 27 is connected to a third current input path 18 that forms a second current mirror 17 with the fourth current source 10. The third current input path 18 is connected to the second bias current source 12. Thus, the current through the third current input path 18 is the total of the current through the third current path 23 minus the current allowed to pass by the second current source 8 plus the bias current allowed to flow by the second bias current source 12.

The fourth current source 10 is connected to the second current output terminal 4 as a current output path of the second current mirror 17. The fourth current source 10 allows a current to flow that is k/(1−m) times as much as the current through the third current input path 18. Thus, the current flowing into the second current output terminal 4 is k/(1−m) times as much as the current through the third current input path 18.

Figure 2:
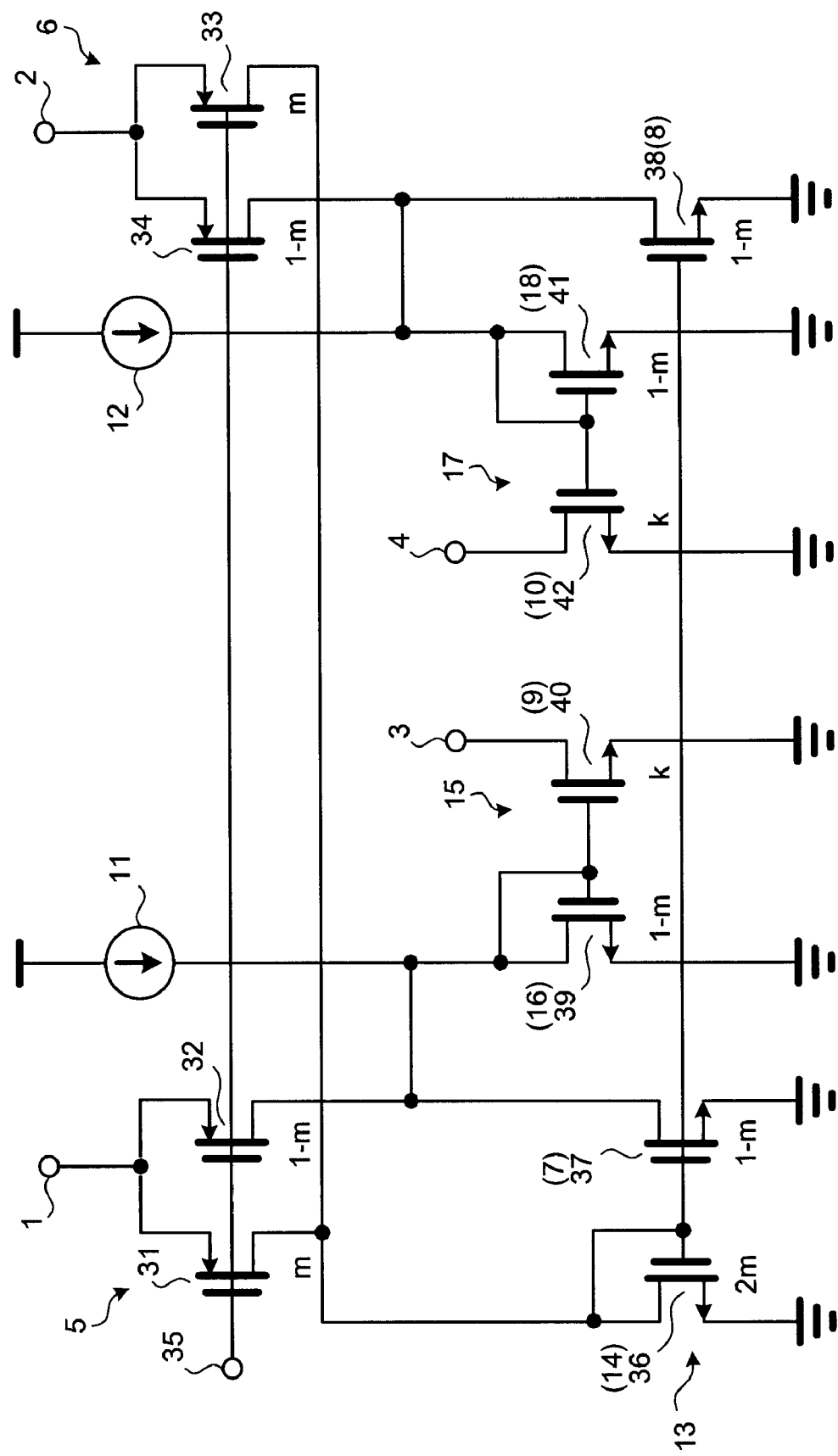
FIG. 2 is a circuit diagram of the differential current mirror circuit implemented with a CMOS analog circuit.

FIG. 2 is a circuit diagram of the differential current mirror circuit shown in FIG. 1 implemented with a CMOS analog circuit. As shown in FIG. 2, the first branching unit 5 and the second branching unit 6 are each implemented with p-channel MOS transistors (hereinafter, "PMOS transistor"). The first current mirror 15, the second current mirror 17, and the third current mirror 13 are each implemented with n-channel MOS transistors (hereinafter, "NMOS transistor").

A first PMOS transistor 31 and a second PMOS transistor 32 form the first branching unit 5. The source terminals of the first PMOS transistor 31 and the second PMOS transistor 32 are connected to the first current input terminal 1. The gate terminals of the first PMOS transistor 31 and the second PMOS transistor 32 are connected to a bias terminal 35 to which a bias voltage is applied.

The drain terminal of the first PMOS transistor 31 is connected to the drain terminal of a first NMOS transistor 36 that forms the first current input path 14. The gate terminal of the first NMOS transistor 36 is connected to the drain terminal thereof. The source terminal of the first NMOS transistor 36 is connected to the ground.

The drain terminal of the second PMOS transistor 32 is connected to the drain terminal of a second NMOS transistor 37 that forms the first current source 7. The gate terminal of the second NMOS transistor 37 is connected to the gate terminal of the first NMOS transistor 36. The source terminal of the second NMOS transistor 37 is connected to the ground. The first NMOS transistor 36 and the second NMOS transistor 37 form the third current mirror 13.

The drain terminal of a third NMOS transistor 39 that forms the second current input path 16 is connected to the drain terminal of the second PMOS transistor 32 and the first bias current source 11. The gate terminal of the third NMOS transistor 39 is connected to the drain terminal thereof. The source terminal of the third NMOS transistor 39 is connected to the ground.

The drain terminal of a fourth NMOS transistor 40 that forms the third current source 9 is connected to the first current output terminal 3. The gate terminal of the fourth NMOS transistor 40 is connected to the gate terminal of the third NMOS transistor 39. The source terminal of the fourth NMOS transistor 40 is connected to the ground. The third NMOS transistor 39 and the fourth NMOS transistor 40 form the first current mirror 15.

A third PMOS transistor 33 and a fourth PMOS transistor 34 form the second branching unit 6. The source terminals of the third PMOS transistor 33 and the fourth PMOS transistor 34 are connected to the second current input terminal 2. The gate terminals of the third PMOS transistor 33 and the fourth PMOS transistor 34 are connected to the bias terminal 35.

The drain terminal of the third PMOS transistor 33 is connected to the drain terminal of the first NMOS transistor 36. The drain terminal of the fourth PMOS transistor 34 is connected to the drain terminal of a fifth NMOS transistor 38 that forms the second current source 8. The gate terminal of the fifth NMOS transistor 38 is connected to the gate terminal of the first NMOS transistor 36. The source terminal of the fifth NMOS transistor 38 is connected to the ground. The fifth NMOS transistor 38 forms the third current mirror 13.

The drain terminal of a sixth NMOS transistor 41 that forms the third current input path 18 is connected to the drain terminal of the fourth PMOS transistor 34 and the second bias current source 12. The gate terminal of the sixth NMOS transistor 41 is connected to the drain terminal thereof. The source terminal of the sixth NMOS transistor 41 is connected to the ground.

The drain terminal of a seventh NMOS transistor 42 that forms the fourth current source 10 is connected to the second current output terminal 4. The gate terminal of the seventh NMOS transistor 42 is connected to the gate terminal of the sixth NMOS transistor 41. The source terminal of the seventh NMOS transistor 42 is connected to the ground. The sixth NMOS transistor 41 and the seventh NMOS transistor 42 form the second current mirror 17.

As one example, the gate lengths of the first PMOS transistor 31, the second PMOS transistor 32, the third PMOS transistor 33, and the fourth PMOS transistor 34 are substantially identical. The ratio of gate widths of the second PMOS transistor 32 and the first PMOS transistor 31 is (1−m):m. The ratio of gate widths of the fourth PMOS transistor 34 and the third PMOS transistor 33 is (1−m):m.

The gate lengths of the first NMOS transistor 36, the second NMOS transistor 37, the third NMOS transistor 39, the fourth NMOS transistor 40, the fifth NMOS transistor 38, the sixth NMOS transistor 41, and the seventh NMOS transistor 42 are substantially identical. The ratio of gate widths of the first NMOS transistor 36, the second NMOS transistor 37, and the fifth NMOS transistor 38 is 2m:(1−m):(1−m). The ratio of gate widths of the third NMOS transistor 39 and the fourth NMOS transistor 40 is (1−m):k. The ratio of gate widths of the sixth NMOS transistor 41 and the seventh NMOS transistor 42 is (1−m):k.

The differential current mirror circuit shown in FIG. 1 operates as follows. The input current $I_{in1}$ to the first current input terminal 1 and the input current $I_{in2}$ to the second current input terminal 2 shown in FIG. 1 are given by the following equations (1) and (2), respectively.

$$I_{in1}=I_{com}+I_{dif}/2 \quad (1)$$

$$I_{in2}=I_{com}-I_{dif}/2 \quad (2)$$

where, $I_{com}$ and $I_{dif}$ are an in-phase component and a differential component, respectively, of a differential current signal between $I_{in1}$ and $I_{in2}$.

The current $I_{div1a}$ through the first current path 21 and the current $I_{div1b}$ through the second current path 22 are given by the following equations (3) and (4) based on equation (1), respectively, since the ratio of the currents branched by the first branching unit 5 is (1−m):m.

$$I_{div1a}=(1-m)(I_{com}+I_{dif}/2) \quad (3)$$

$$I_{div1b}=m(I_{com}+I_{dif}/2) \quad (4)$$

Similarly, the current $I_{div2a}$ through the third current path 23 and the current $I_{div2b}$ through the fourth current path 24 are given by the following equations (5) and (6) based on equation (2), respectively, since the ratio of the currents branched by the second branching unit 6 is (1−m):m.

$$I_{div2a}=(1-m)(I_{com}-I_{dif}/2) \quad (5)$$

$$I_{div2b}=m(I_{com}-I_{dif}/2) \quad (6)$$

A current $I_{m3i}$ through the first current input path 14 of the third current mirror 13 is given by the following equation (7) based on equations (4) and (6), since the sum of $I_{div1b}$ and $I_{div2b}$ flows through the fifth current path 25.

$$I_{m3i}=I_{div1b}+I_{div2b}=2m \cdot I_{com} \quad (7)$$

Since the amplification ratio of the third current mirror 13 is (1−m)/2m, the first current source 7 and the second current source 8 respectively allow a current $I_{m3o}$ to flow that is (1−m)/2m times as much as $I_{m3i}$ through the first current input path 14. $I_{m3i}$ is given by the following equation (8) based on equation (7).

$$I_{m3o}\{(1-m)/(2m)\}I_{m3i}=(1-m)I_{com} \quad (8)$$

Since the first current source 7 subtracts $I_{m3o}$ from $I_{div1a}$ that flows from the first branching unit 5 to the first current path 21, a current given by the following equation (9) flows through the sixth current path 26. Since the current through the sixth current path 26 and the bias current $I_{bias}$ allowed to flow by the first bias current source 11 flow through the second current input path 16 of the first current mirror 15, the current $I_{m1i}$ that flows through the second current input path 16 is given by the following equation (10) based on equations (9), (3), and (8).

$$I_{div1a}-I_{m3o} \quad (9)$$

$$I_{m1i}=I_{div1a}-I_{m3o}+I_{bias}=(1-m)I_{dif}/2+I_{bias} \quad (10)$$

Similarly, a current given by the following equation (11) flows through the seventh current path 27. The current $I_{m2i}$ that flows through the third current input path 18 of the second current mirror 17 is given by the following equation (12) based on equations (11), (5), and (8).

$$I_{div2a}-I_{m3o} \quad (11)$$

$$I_{m2i}=I_{div2a}-I_{m3o}+I_{bias}=-(1-m)I_{dif}/2+I_{bias} \quad (12)$$

As clearly shown in equations (10) and (12), the currents $I_{m1i}$ and $I_{m2i}$ that flow through the second current input path 16 of the first current mirror 15 and the third current input path 18 of the second current mirror 17, respectively, do not include any in-phase component $I_{com}$ of the input currents to the first current input terminal 1 and the second current input terminal 2. That is, the in-phase component is eliminated at this stage.

Since the amplification ratio of the first current mirror 15 and the second current mirror 17 is k/(1−m), a current $I_{out1}$ that flows through the first current output terminal 3 is k/(1−m) times as much as $I_{m1i}$ through the second current input path 16, as given by the following equation (13) based on equation (10). Similarly, a current $I_{out2}$ given by the following equation (14) flows through the second current output terminal 4.

$$I_{out1}=\{k/(1-m)\}I_{m1i}=k \cdot I_{dif}/2+\{k/(1-m)\}I_{bias} \quad (13)$$

$$I_{out2}=(k/(1-m))I_{m2i}=-k \cdot I_{dif}/2+\{k/(1-m)\}I_{bias} \quad (14)$$

The differential component of the output current is given by the following equation (15) based on equations (13) and (14). That is, the differential current mirror circuit shown in FIG. 1 amplifies the differential component $I_{dif}$ of the input current k times.

$$I_{out1}-I_{out2}=k \cdot I_{dif} \quad (15)$$

As described above, the differential current mirror circuit shown in FIG. 1 adds arbitral bias currents $I_{bias}$ to the currents in which the in-phase component is cancelled to leave only the differential component, amplifies the resultant currents by the current mirrors 15 and 17 by a given magnitude taking into account the attenuation caused by the branching units 5 and 6, and outputs the amplified current to the current output terminals 3 and 4. Preferably the value of m is small, since a small m enables the circuit to achieve high-speed differential signal processing while detecting and eliminating in-phase signal without significantly increasing the loads of the current mirrors 13, 15, and 17. Preferably, the value of m is about ¼, but not limited thereto.

Figure 3:
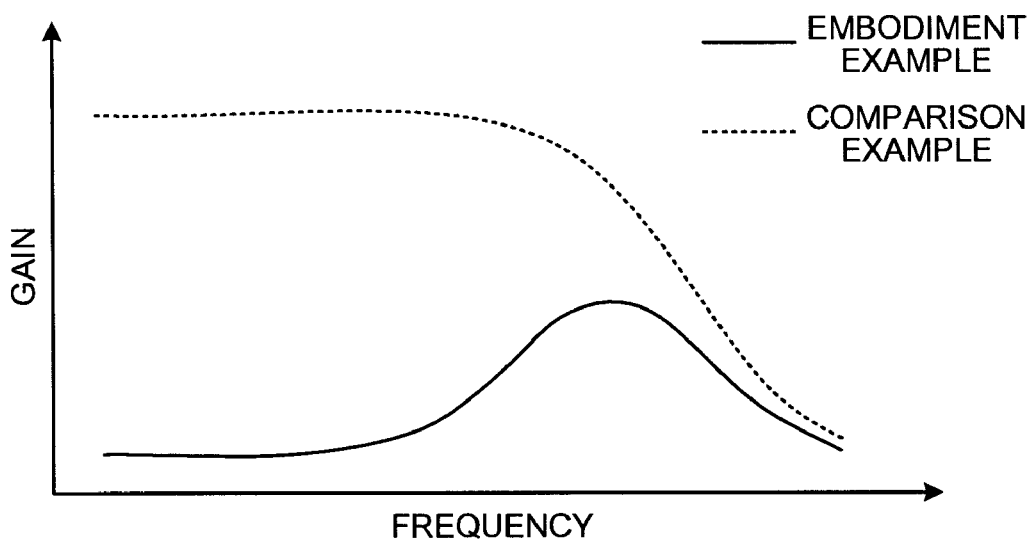
FIG. 3 is a diagram of the relationship between the frequency and the gain of the differential current mirror circuit with respect to in-phase signal.
Figure 4:
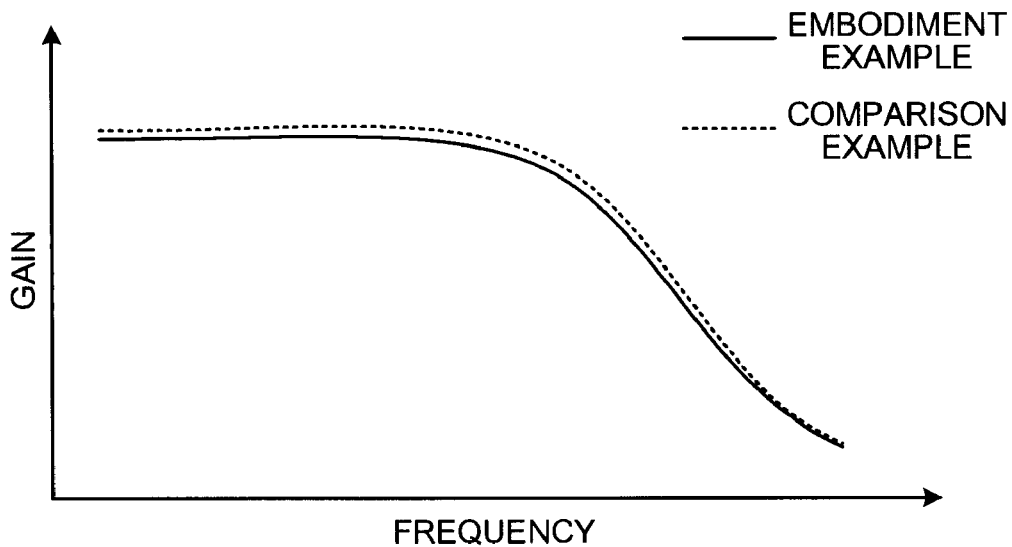
FIG. 4 is a diagram of the relationship between the frequency and the gain of the differential current mirror circuit with respect to differential signal.

FIGS. 3 and 4 are diagrams of the relationship between the frequency and the gain of the differential current mirror circuit shown in FIG. 2, an embodiment example. FIG. 3 illustrates the characteristics with respect to an in-phase signal, while FIG. 4 illustrates the characteristics with respect to a differential signal. The solid line indicates the characteristics of the embodiment example, while the dashed line indicates the characteristics of a pseudo differential circuit, a comparison example, that includes only the third NMOS transistor 39 (of which drain terminal functions as the current input terminal), the fourth NMOS transistor 40, the sixth NMOS transistor 41 (of which drain terminal functions as the current input terminal), and the seventh NMOS transistor 42.

As shown in the figures, the embodiment example can reduce the in-phase signal. With respect to the differential signal, the embodiment example can operate as fast as the comparison example. Thus, the first embodiment achieves accurate signal processing without impairing the advantage of the current signal processing, that is, fast and low-voltage operation. Such a differential current mirror circuit can be generally used for analog circuits such as high-frequency circuits for optical communication and/or radio communication.

Figure 5:
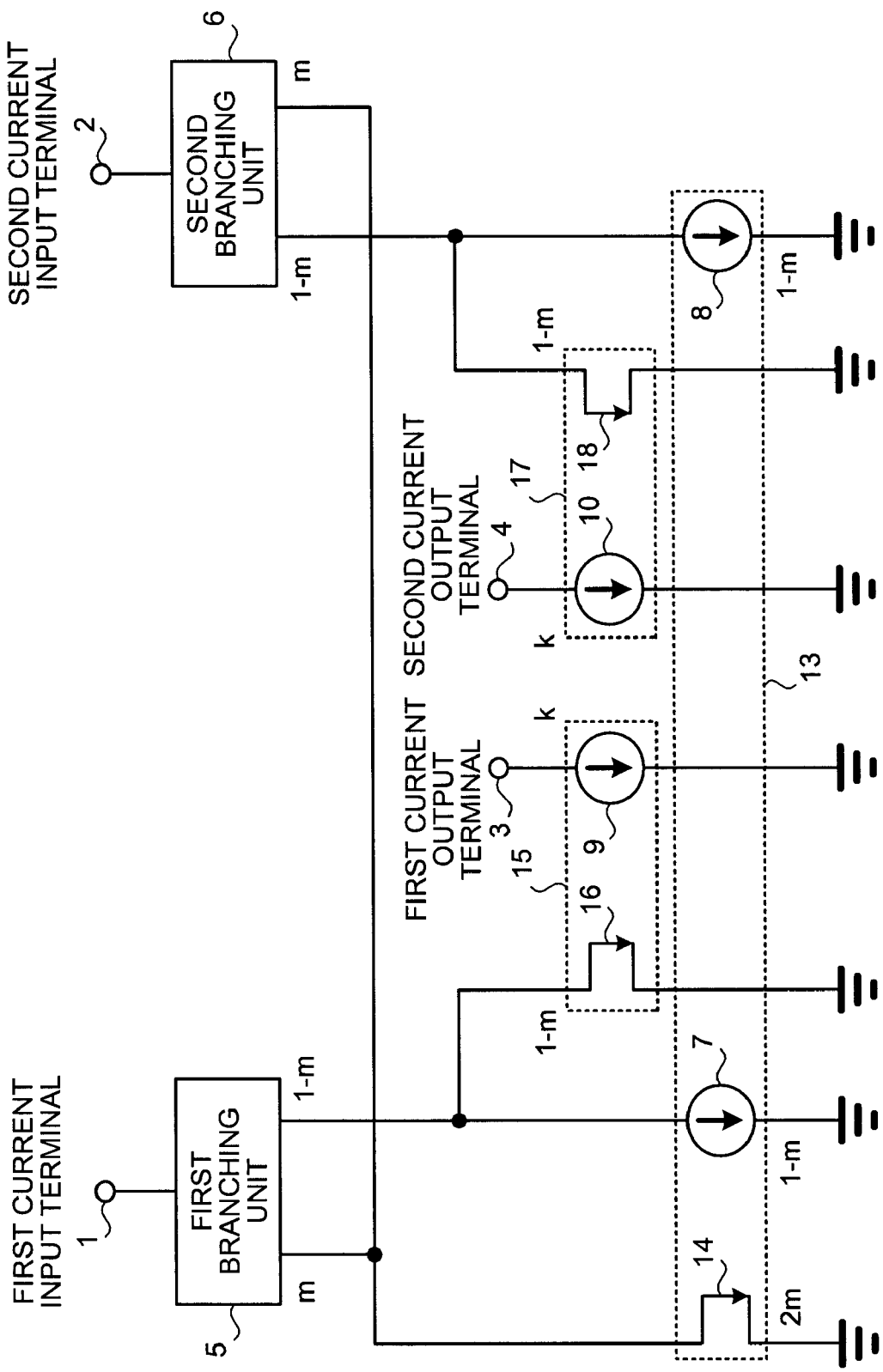
FIG. 5 is a circuit diagram of a differential current mirror circuit according to a second embodiment.

FIG. 5 is a circuit diagram of a differential current mirror circuit according to a second embodiment. The second embodiment differs from the first embodiment shown in FIG. 1 in that the second current input path 16 of the first current mirror 15 and the third current input path 18 of the second current mirror 17 are not connected to any bias current source, e.g., the first bias current source 11 and/or the second bias current source 12 shown in FIG. 1. This configuration also has the same advantages as those of the first embodiment.

Figure 6:
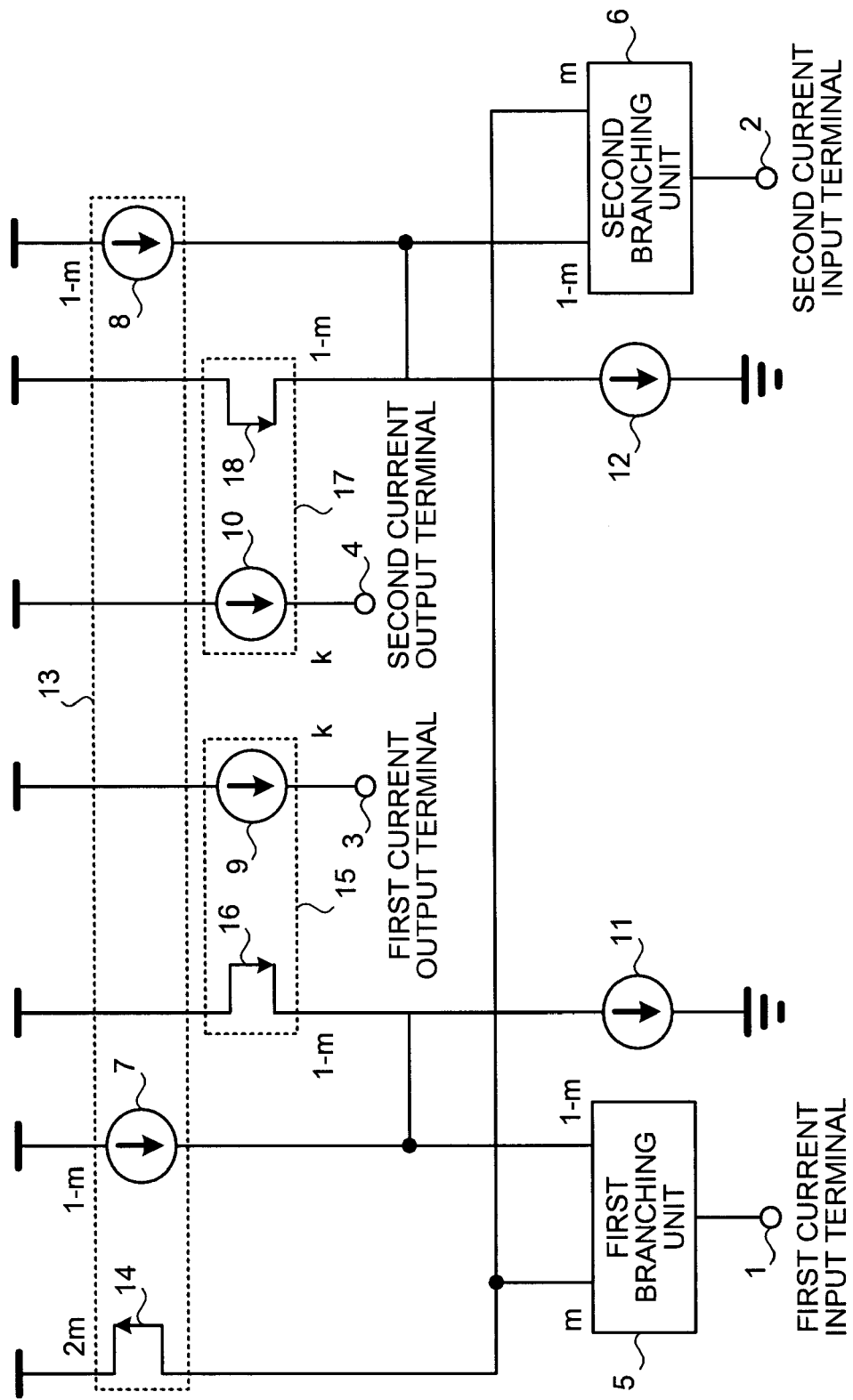
FIG. 6 is a circuit diagram of a differential current mirror circuit according to a third embodiment.
Figure 7:
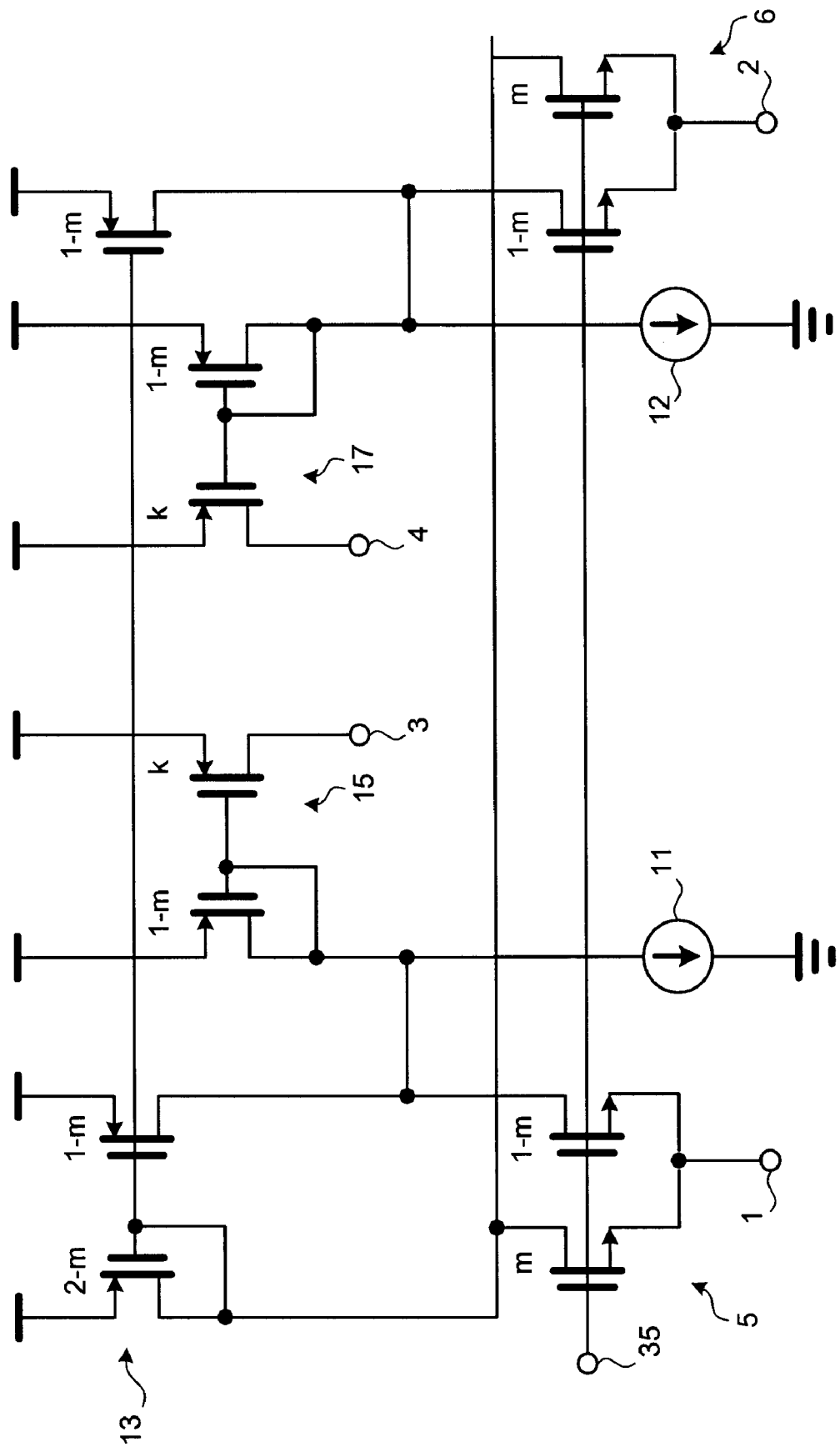
FIG. 7 is a circuit diagram of the differential current mirror circuit of the third embodiment implemented with a CMOS analog circuit.

FIG. 6 is a circuit diagram of a differential current mirror circuit according to the third embodiment. In the third embodiment shown in FIG. 6, the first current mirror 15, the second current mirror 17, and the third current mirror 13 take the current source as a reference. FIG. 7 is a circuit diagram of the differential current mirror circuit shown in FIG. 6 implemented with a CMOS analog circuit. As shown in FIG. 7, the first branching unit 5 and the second branching unit 6 are implemented with NMOS transistors, while the first current mirror 15, the second current mirror 17, and the third current mirror 13 are implemented with PMOS transistors. This configuration also has the same advantages as those of the first embodiment.

Figure 8:
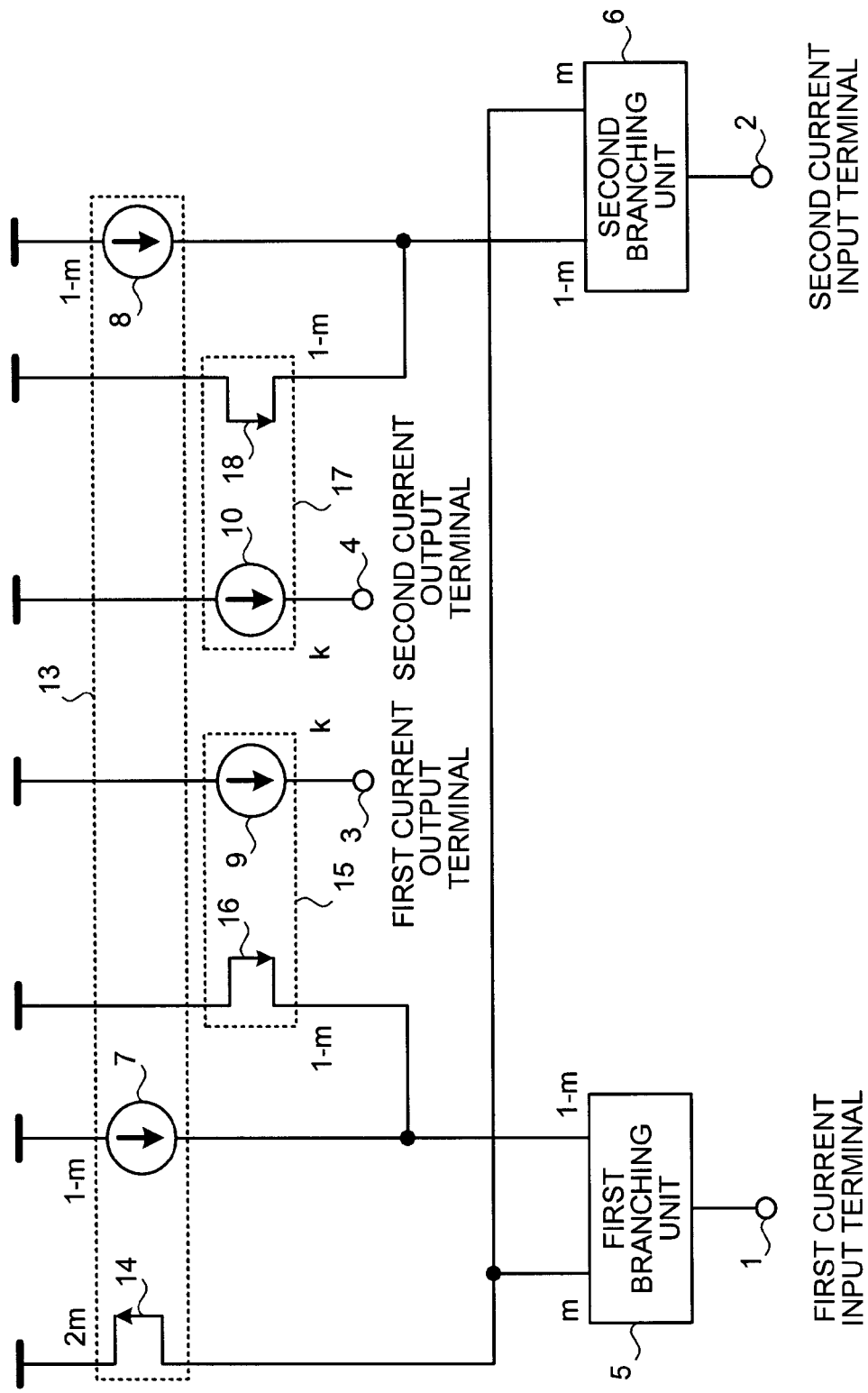
FIG. 8 is a circuit diagram of a differential current mirror circuit according to a fourth embodiment.

FIG. 8 is a circuit diagram of a differential current mirror circuit according to the fourth embodiment. The fourth embodiment differs from the third embodiment shown in FIG. 6 in that the second current input path 16 of the first current mirror 15 and the third current input path 18 of the second current mirror 17 are not connected to any bias current source (the first bias current source 11 and/or the second bias current source 12 shown in FIG. 6). This configuration also has the same advantages as those of the first embodiment.

As described above, according to the embodiments, the differential current mirror circuit outputs a current without an in-phase component from the current output terminal, i.e., a differential component current is output, thereby enabling accurate signal processing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A differential current mirror circuit comprising:
    a first current input terminal through which a current including an in-phase component and a differential component flows;
    a second current input terminal through which a current including an in-phase component and a differential component flows;
    a first branching unit that branches the current through the first current input terminal to a first current path and a second current path;
    a second branching unit that branches the current through the second current input terminal to a third current path and a fourth current path;
    a fifth current path that is connected to the second current path and the fourth current path;
    a first current source that allows an in-phase component current to flow through the first current path based on a current through the fifth current path;
    a sixth current path through which a current through the first current path minus the current allowed to flow by the first current source flows;
    a first current output terminal through which a current flows based on the current through the sixth current path;
    a second current source that allows an in-phase component current to flow through the third current path based on the current through the fifth current path;
    a seventh current path through which a current through the third current path minus the current allowed to flow by the second current source flows; and
    a second current output terminal through which a current flows based on the current through the seventh current path.

2. The differential current mirror circuit according to claim 1, wherein the first current source functions as a current mirror that copies the current through the fifth current path as the in-phase component current through the first current path.

3. The differential current mirror circuit according to claim 1, wherein the second current source functions as a current mirror that copies the current through the fifth current path as the in-phase component current through the third current path.

4. The differential current mirror circuit according to claim 2, wherein
    the ratio of currents through the first current path and the second current path is $(1-m):m$, where m is larger than 0 and less than 1,
    the ratio of currents through the third current path and the fourth current path is $(1-m):m$,
    the first current source allows the current that is $(1-m)/2m$ times as much as the current through the fifth current path to flow through the first current path, and
    the second current source allows the current that is $(1-m)/2m$ times as much as the current through the fifth current path to flow through the third current path.

5. The differential current mirror circuit according to claim 1, further comprising:
    a third current source that allows a current copied by a current mirror and copied from the current through the sixth current path to flow through the first current output terminal; and
    a fourth current source that allows a current copied by a current mirror and copied from the current through the seventh current path to flow through the second current output terminal.

6. The differential current mirror circuit according to claim 1, further comprising:
    a first bias current source that allows a bias current to flow through the sixth current path; and
    a second bias current source that allows a bias current to flow through the seventh current path.

7. The differential current mirror circuit according to claim 1, wherein the differential current mirror circuit is implemented with a CMOS analog circuit.

* * * * *